United States Patent [19]

Meyer

[11] Patent Number: 5,737,343
[45] Date of Patent: Apr. 7, 1998

[54] CIRCUIT FOR LOCALIZING ERRORS IN REED-SOLOMON DECODERS

[75] Inventor: Jacques Meyer, Corenc, France

[73] Assignee: SGS-Thomson Microelectronics S.A., Saint Genis, France

[21] Appl. No.: 493,830

[22] Filed: Jun. 22, 1995

[30] Foreign Application Priority Data

Jun. 27, 1994 [FR] France .................................. 94 08122

[51] Int. Cl.$^6$ .................................................. H03M 13/00
[52] U.S. Cl. ........................................................ 371/37.1
[58] Field of Search ......................... 371/37.1; 364/746.1

[56] References Cited

U.S. PATENT DOCUMENTS

| | | | |
|---|---|---|---|
| 4,504,948 | 3/1985 | Patel | 371/38 |
| 4,649,541 | 3/1987 | Lahmeyer | 371/37.1 |
| 4,747,103 | 5/1988 | Iwamura et al. | 371/37.4 |
| 4,868,828 | 9/1989 | Shao et al. | 371/5.1 |
| 4,888,778 | 12/1989 | Brechard et al. | 371/37.4 |
| 5,170,399 | 12/1992 | Cameron et al. | 371/37.1 |
| 5,185,711 | 2/1993 | Hattori | 364/746.1 |
| 5,325,373 | 6/1994 | Iwamura et al. | 371/37.1 |
| 5,442,578 | 8/1995 | Hattori | 364/746.1 |
| 5,504,758 | 4/1996 | Inoue et al. | 371/37.1 |
| 5,517,509 | 5/1996 | Yoneda | 371/37.1 |

OTHER PUBLICATIONS

Jeong et al., "VLSI Array Synthesis for Polynomial GCD Computation and Application to Finite Field Division", IEEE Transactions on Circuits and Systems:—I Fundamental theory and Applications, vol. 41, No. 12, Dec. 1994, pp. 891–897.

Shao et al., "A VLSI Design of a Pipeline Reed–Solomon Decoder", IEEE Transactions on Computers, vol. c-34, No. 5, May 1985, pp. 393–403.

Whiting, "Bit-Serial Reed Solomon Decoders in VLSI", Ph.D. Thesis, California Institute of Technology, 1985, pp. 56–57, Dec. 1985.

French Search Report from French Patent Application No. 94 08122, filed Jun. 27, 1994.

GEC Journal of Research (Incorporating Marconi Review), vol. 9, No. 3, 1992, Great Baddow Chemsford GB, pp. 172–184, Arambepola & Choomchuay, "Algorithms and Architectures for Reed–Solomon Codes".

Proceedings Of the Int. Conf. On Application Specific Array Processors, Sep. 5, 1990, Princeton, NJ, US Nelson, Rahman & McQuade "Systolic Architectures For Decoding Reed–Solomon Codes".

IEEE Transactions On Computers, vol. 37, No. 10, Oct. 1988, New York, US, pp. 1273–1280, Shao & Reed "On The VLSI Design Of A Pipeline Reed–Solomon Decoder Using Systolic Arrays".

*Primary Examiner*—Stephen M. Baker
*Attorney, Agent, or Firm*—Wolf, Greenfield & Sacks, P.C.; James H. Morris

[57] ABSTRACT

In a Reed-Solomon error correction system, the coefficients of the syndrome polynomial of degree $2t-1$ are stored in a first set of registers R, coefficients $0,0 \ldots, 0,1,0$ are stored in a second set of registers $\lambda$, and a first number is stored in a counter. Coefficients $1,0 \ldots, 0$ are stored in a third set of registers Q, zeroes are stored in a fourth set of registers $\mu$, and a number exceeding the first number by 1 is stored in an indicator register.

a) If the content of the counter is higher than or equal to the content of the indicator register, or if the content of the last register of the first set of registers R is zero, value $Q_{2t-1} R_{i-1} + R_{2t-1} Q_{i-1}$ is stored in each register $R_i$ of the first set of registers R, and value $Q_{2t-1} \lambda_{i-1} + R_{2t-1} \lambda_{i-1}$ is stored in each register $\lambda_i$ of the third set of registers $\lambda$.

b) Otherwise, the contents of the first set of registers R, the second set of registers $\lambda$, and the counter are further transferred into the third set of registers Q, the fourth set of registers $\mu$, and the indicator register, respectively. Steps a) or b) are repeated until the content of the counter is decremented by t.

19 Claims, 3 Drawing Sheets

CIRCUIT FOR LOCALIZING ERRORS IN REED-SOLOMON DECODERS

BACKGROUND OF THE INVENTION

1. Field of the Invention

The present invention relates to a Reed-Solomon decoder for correcting errors on digital data during a transmission (by electric, radio, or any other suitable signals), and more particularly to Reed-Solomon decoder methods and apparatus for providing, in a suitable order, data to be corrected and the respective correction values.

2. Discussion of the Related Art

Reed-Solomon (RS) encoding consists in providing packets of data to transmit in the form of RS codes, whereby these packets of data may then be extracted from the RS codes and corrected in a receiver. An RS code is a set of M digital data which are associated with coefficients of a polynomial of degree M−1 which is a multiple of a generator polynomial of degree 2t having 2t distinct roots. In transmitting such RS code, up to t erroneous coefficients can be localized and corrected.

In addition, the coefficients of an RS code are associated with elements of a finite field. Thus, if the coefficients to be transmitted are n-bit numbers, a finite field of $2^n$ elements, noted $GF(2^n)$, will be used. In this finite field, an RS code may include up to $N=2^n-1$ coefficients.

In a finite field, the addition of two numbers is defined by a bit-to-bit Exclusive-OR between these two numbers. As a consequence, $\alpha+\alpha=0$ if $\alpha$ is an arbitrary element of a finite field. The multiplication is defined so that the product of two elements of the finite field is also an element of the finite field. Thus, any non-null element of the finite field is a power of another non-null and non-unitary element of this finite field. In a finite field of N+1 elements, the powers are defined modulus N, i.e., $\alpha^i = \alpha^{i+N}$, where $\alpha$ is a non-null and non-unitary element of the finite field and i is a positive or negative integer. Accordingly, the non-null elements of a finite field of N+1 elements can be written $\alpha^0, \alpha^1, \ldots, \alpha^{N-1}$.

To transmit a set of data $a_{N-2t-1}, \ldots, a_0$ according to an RS code ($M \leq N$), the following polynomial is formed:

$$a(x) = a_{N-2t-1} x^{N-2t-1} + \ldots + a_1 x + a_0.$$

Then, the coefficients of a polynomial A(x), where $$A(x) = x^{2t} a(x) + r(x),$$

are transmitted, where r(x) is the remainder of the division of the polynomial $x^{2t} a(x)$ by a generator polynomial. Thus, the coefficients A of polynomial A(x) constitute an RS code, and the coefficients corresponding to the terms of degrees 2t to N−1 are the effective coefficients a to be transmitted. Of course, the transmission is subject to errors and some of the received coefficients A may be erroneous.

The correction of errors is carried out as follows. A syndrome polynomial S(x) (hereafter referred to as a syndrome) of degree 2t−1 is formed, whose coefficient of the term of degree i (i=0, 1, . . . , 2t−1) is written:

$$S_i = A(\alpha^i),$$

where $\alpha^0, \alpha^1, \ldots, \alpha^{2t-1}$ are the roots of the generator polynomial. If no transmission error occurred, the syndrome is null, since the roots of the generator polynomial are also roots of the polynomial A(x).

Otherwise, a polynomial $\lambda(x)$, referred to as an error locator polynomial, of degree less than or equal to t, and a polynomial R(x), referred to as an error correction polynomial, of degree less than t, are searched for such that:

$$x^{2t} \gamma(x) + \lambda(x) S(x) = R(x),$$

where $\gamma(x)$ is a polynomial which is not to be determined.

Polynomial $\lambda(x)$ has t distinct roots at most. If $\alpha^r$ is a root of polynomial $\lambda(x)$, coefficient $A_{N-r}$ has been transmitted with an error. The error on this coefficient is expressed by:

$$e_r = R(\alpha^r)/\alpha^r \lambda'(\alpha^r), \quad (1)$$

where $\lambda'$ is the derivative polynomial of polynomial $\lambda$.

The Euclid algorithm is used to calculate polynomials $\lambda(x)$ and R(x). The Euclid algorithm starts from the following equation system $$0 \; x^{2t}+1 \; S(x)=S(x),$$

$$1 \; x^{2t}+0 \; S(x)=x^{2t},$$

and, at each of at most 2t steps, a new system is formed from the preceding one by replacing one of the equations with a linear combination of the two equations so that the term of highest degree of the second member is cancelled. Among the two preceding equations, the equation whose second member is of lowest degree is maintained. The operation is repeated in the same manner until an equation with a second member of degree lower than t is obtained. Then, the second member is the polynomial R(x) and the polynomial $\lambda(x)$ is the one which multiplies S(x) in the same equation.

The article of IEEE Transactions on Computers, Vol. C-34, No. 5, May 1985, "A VLSI Design of a Pipeline Reed-Solomon Decoder" describes an exemplary use of the Euclid algorithm and a circuit for carrying out the Euclid algorithm in this example. This circuit is particularly complex because it requires a relatively complex cell for each calculating step of the algorithm. In addition, each calculating cell must be designed to take into account particular cases (for example, null polynomial coefficients).

SUMMARY OF THE INVENTION

An object of the present invention is to provide a particularly simple circuit for carrying out the Euclid algorithm.

A further object of the present invention is to provide a control method of this circuit for carrying out the Euclid algorithm.

In an embodiment of the invention, a Reed-Solomon decoder includes first and second sets of registers whose contents are respectively initialized at values corresponding to the coefficients of a syndrome polynomial of degree 2t−1 and at values which are all zero except for the second value which is equal to 1; third and fourth sets of registers connected to the outputs of the first and second sets of registers and whose contents are initialized at values which are zero except for that of the last register of the third set which is initialized at 1. A calculation circuit is associated with each register of the first and second sets to provide each register, except for the first register of the first set, with the sum of the product of the content of the preceding register of these first and second sets by the content of the last register of the third set and the product of the content of the corresponding register of the third and fourth sets by the content of the last register of the first set. The embodiment further includes a counter and an indicator register which are respectively initialized at a first number and at a number exceeding the first number by 1, the indicator register being connected to an output of the counter and the counter being connected to an output of the indicator register. A sequencer is provided for a) enabling writing of the first and second sets of registers and decrementing the content of the counter if this content is higher than or equal to the content of the indicator register, or if the content of the last register of the first set is zero, or b) enabling writing of the first, second, third and fourth sets of registers and the indicator register if the content of the counter is lower than the content of the indicator register and if the content of the last register of the first set is non-zero. The sequencer stops when the content of the counter is decreased by t.

According to an embodiment of the invention, each calculation circuit includes first and second lines successively receiving the bits of the last registers of the first and third sets, respectively; a first set of gates which transmit the output of the associated register of the first and second sets, respectively, if the second line is at 1, and a second set of gates which transmit the output of the associated register of the third and fourth sets if the first line is at 1; a first adder which receives the outputs of the first and second sets of gates; and a second adder which adds the output of the first adder to the content of a multiplication register, the content of this multiplication register is successively shifted to the left, and a carry is recombined with this content so that a multiplication in a finite field is carried out.

According to an embodiment of the invention, the calculation circuit associated with the first register of the second set executes calculations from the contents of the last registers of the second and fourth sets.

According to an embodiment of the invention, the counter is connected to the output of the indicator register the indicator register is connected to the output of the counter and the sequencer is operable to enable writing of the counter and to decrement the counter at each step b).

Another embodiment of the invention is directed to a method for determining the coefficients required to correct up to t errors in data transmitted as Reed-Solomon codes. The method includes the steps of determining the coefficients of a syndrome polynomial of degree 2t-1; storing the coefficients of the syndrome polynomial in a first set of registers, storing coefficients which are all zero except for the second, equal to 1, in a second set of registers, and storing a first number in a counter; storing coefficients which are all zero, except for the last one, equal to 1, in a third set of registers, storing coefficients which are all zero in a fourth set of registers, and storing a number exceeding the first number by 1 in an indicator register; a) if the content of the counter is greater than or equal to the content of the indicator register, or if the content of the last register of the first set is zero, storing in each register of the first set the sum of the product of the content of the preceding register of the first set by the content of the last register of the third set and the product of the content of the corresponding register of the third set by the content of the last register of the first set, and storing in each register of the second set the sum of the product of the content of the preceding register of the second set by the content of the last register of the third set, and the product of the content of the corresponding register of the fourth set by the content of the last register of the first set, and decrementing the counter; b) otherwise, further transferring the contents of the first and second sets of registers and of the counter into the third and fourth sets of registers and the indicator register respectively; and repeating steps a) or b) until the content of the counter is decremented by t, and then reading the coefficients of an error correction polynomial and the coefficients of an error locator polynomial, respectively, in the first and second sets of registers.

According to an embodiment of the invention, the first and third sets include 2t registers, and the second and fourth sets include t+1 registers. The first register of the second set receives the sum obtained from a product of the last registers of the second and third sets and a product of the last registers of the first and fourth sets.

According to an embodiment of the invention, at step b), the contents of the counter and of the indicator register are swapped, and the counter is then decremented.

According to an embodiment of the invention, the number initially stored in the counter is t.

According to an embodiment of the invention, each sum of products is obtained by the steps of successively establishing first partial products of the bits of the last register of the first set by the content of a register of the third or fourth sets; successively establishing second partial products of the bits of the last register of the third set by the content of a register of the first or second sets; and successively forming the sums of the first and second partial products and adding these sums to the content of a register, left-shifted at each addition.

The foregoing and other objects, features, aspects and advantages of the invention will become apparent from the following detailed description of the present invention when taken in conjunction with the accompanying drawings.

DETAILED DESCRIPTION

Carrying out the Euclid algorithm starts from the system of equations:

$$0 \; x^{2t}+1 \; S(x)=S(x), \text{ and}$$

$$1 \; x^{2t}+0 \; S(x)=x^{2t}.$$

According to the invention, a set of registers R, a set of registers λ, and a counter dR are associated with the first equations of the successive systems obtained by carrying out the Euclid algorithm. Similarly, a set of registers Q, a set of registers μ, and an indicator register dQ are associated with the second equations of the successive systems.

The set of registers R includes 2t registers $R_{2t-1}$, $R_{2t-2}$, ..., $R_0$, corresponding to the coefficients of the terms of decreasing degrees of the second member of each first equation. The set of registers λ includes t+1 registers $\lambda_t$ to $\lambda_0$, corresponding to the coefficients of the terms of decreasing degrees of the factor of S(x) in each first equation. Counter dR contains a number representative of the degree of the second member of each first equation.

Similarly, registers Q are associated with the second member of each second equation, registers μ are associated with the factor of S(x) in each second equation, and the indicator register dQ is associated with the degree of the second member of each second equation.

Initially, in the order of decreasing degrees, the set of registers R stores the syndrome coefficients, the set of registers λ stores numbers 0,0, . . . ,0,1,0, the set of registers Q stores numbers 1,0, . . . ,0, and the set of registers μ stores zeros. Counter dR and register dQ are respectively initialized at 2t−1 and 2t, for example. Then, the method operates on the registers in 2t−1 steps, each including one of the following steps (in the equations, the register identifiers also designate the contents of the registers).

a) If the content of counter dR is higher than or equal to the content of register dQ, or if the content of register $R_{2t-1}$ is null, the content of each register $R_i$ (i=1,2, . . . 2t−2) is modified according to the following equation:

$$R_i = R_{2t-1} Q_{i-1} + Q_{2t-1} R_{i-1}.$$

The content of register $R_0$ is cancelled at the first step a).

Similarly, each register λi (i=1,2, . . . t) is modified according to the following equation:

$$\lambda i = R_{2t-1} \mu_{i-1} + Q_{2t-1} \lambda_{i-1},$$

the content of register $\lambda_0$ being replaced with $R_{2t-1} \mu_t + Q_{2t-1} \lambda_t$. Counter dR is decremented by one.

In this case, the content of register λ is circularly modified, i.e., register $\lambda_0$ receives a value calculated from the content of register $\lambda_t$. This limits the number of registers. As an alternative, t−1 additional registers could have been provided on the left of each of the sets of registers λ and μ.

b) Otherwise, if the content of counter dR is lower than the content of register dQ, and if the content of register $R_{2t-1}$ is non-null, the contents of the set of registers R and the set of registers λ are transferred into the set of registers Q and the set of registers μ, respectively, and the contents of counter dR and register dQ are swapped. The operations of step a) are also carried out. That is, step b) includes the substeps of step a).

The method stops when counter dR contains a value (t−1, in this case) corresponding to a degree lower than t. Then, the coefficients of the error locator polynomial λ(x) are stored in registers $\lambda_t$ to $\lambda_0$, and the coefficients of the error correction polynomial R(x) are stored in registers $R_{2t-1}$ to $R_t$.

Figure 1:
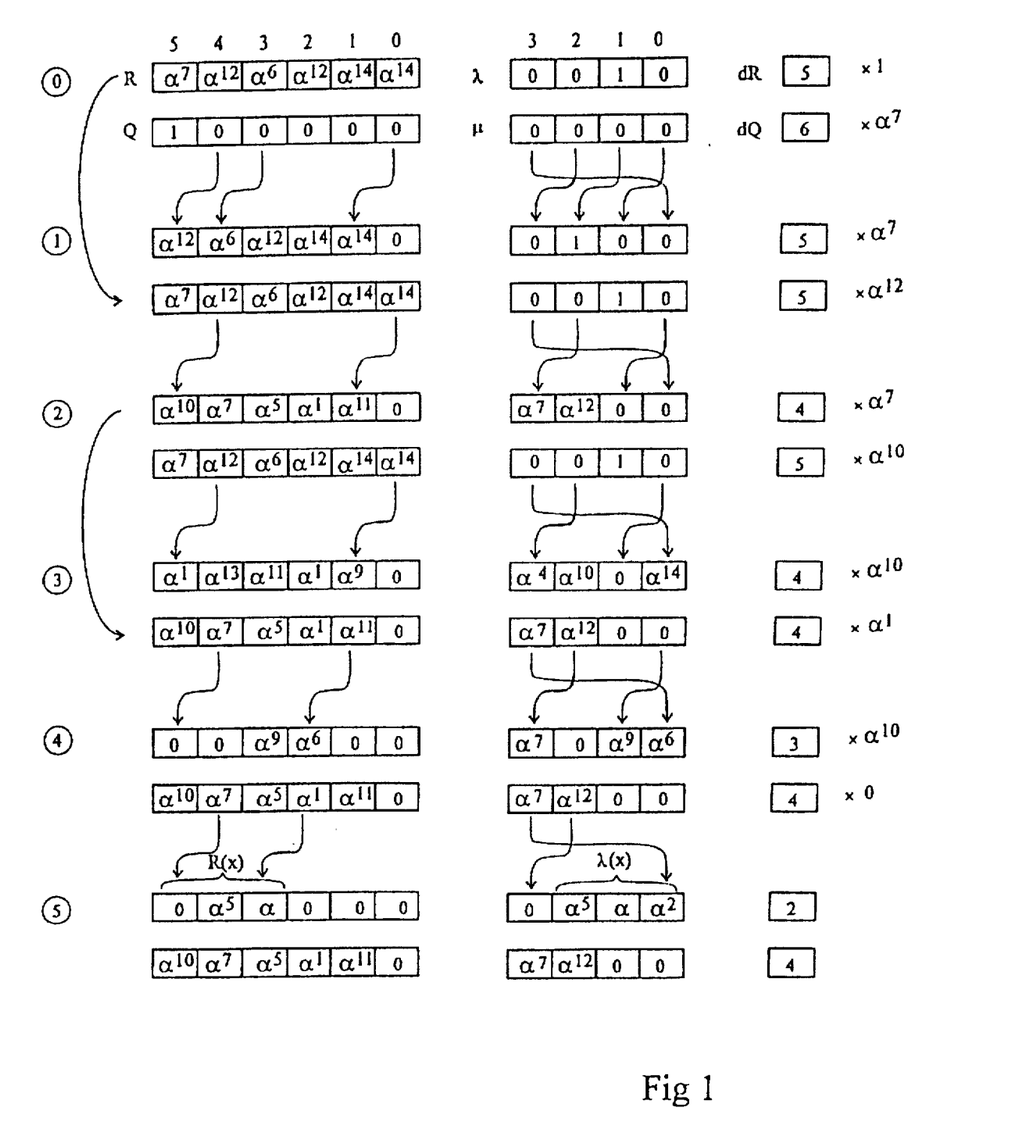
FIG. 1 represents an exemplary succession of steps of the method according to the invention.

FIG. 1 illustrates the use of this method for an exemplary syndrome of degree 5 of a Reed-Solomon code with t=3. The finite field used has 15 non-null elements $\alpha^0$ to $\alpha^{14}$. The considered syndrome polynomial is:

$$S(x) = \alpha^7 x^5 + \alpha^{12} x^4 + \alpha^6 x^3 + \alpha^{12} x^2 + \alpha^{14} x + \alpha^{14}.$$

This example is used in the above article of IEEE Transactions On Computers. To follow the calculations, refer to the table in this article indicating the binary values of elements $\alpha^0$ to $\alpha^{14}$.

FIG. 1 represents the states of registers R, Q, λ, μ and dQ and of counter dR at successive steps, represented by circled numbers, of the method according to the invention. The indexes of the registers are represented over the registers (0 to 5 for the sets of registers R and Q wherein 0 indexes the first register and 5 indexes the last register in the sets of registers R and Q; and 0 to 3 for the sets of registers λ and μ wherein 0 indexes the first register and 3 indexes the last register in the set of register λ and μ).

At an initial step 0, coefficients $\alpha^7$, $\alpha^{12}$, $\alpha^6$, $\alpha^{12}$, $\alpha^{14}$ and $\alpha^{14}$ of the syndrome are stored in registers $R_5$ to $R_0$, respectively. Numbers 0,0,1,0 are stored in registers $\lambda_3$ to $\lambda_0$; numbers 1,0,0,0,0,0 are stored in registers $Q_5$ to $Q_0$; and numbers 0,0,0,0 are stored in registers μ. Number 5, which is the syndrome degree, is stored in counter dR, and number 6 is stored in register dQ.

Step 1 corresponds to step b) described above, since the content of counter dR is lower than the content of register dQ, and since the content of register $R_5$ is non-null. The contents of each of the registers R (except for the last register) and each of the registers λ are multiplied by 1 and the contents of each of the registers Q (except for the last register) and each of registers μ are multiplied by $\alpha^7$. The sums of the obtained products are put into the set of registers R after one simple left-shift, and into the set of registers λ after one circular left-shift. At the same time, the preceding contents of the sets of registers R and λ are transferred into the sets of registers Q and μ. The contents of counter dR and of register dQ are swapped. Then, the content of counter dR is decremented to indicate that the new content of the set of registers R corresponds to a polynomial of degree 5.

Step 2 corresponds to a step a) described above, since the contents of counter dR and of register dQ are equal. The contents of the set of registers R and the set of registers λ are multiplied by $\alpha^7$, and the contents of the set of registers Q and the set of registers μ are multiplied by $\alpha^{12}$. The sums of the obtained products are again put into the set of registers R after one simple left-shift, and into the set of registers λ after one circular left-shift. Counter dR is decremented. The new content of the set of registers R corresponds to a polynomial of degree 4.

The next steps 3 and 4 correspond to a step b) and a step a), respectively. At step 4, the counter dR indicates that the content of the set of registers R corresponds to a polynomial of degree 3. However, this polynomial is in fact a polynomial of degree 1 because the coefficients of the terms of degrees 2 and 3 are null.

Theoretically, the method could stop, but the circuits required to process this particular case would unnecessarily increase the complexity. In the general case, a further step is executed because the content, 3, of counter dR is not lower than t=3.

Step 5 corresponds to a step a) described above since the content of register $R_5$ is zero. The contents of the set of registers R and the set of registers λ are multiplied by $\alpha^{10}$, and the contents of the set of registers Q and the set of registers μ are multiplied by 0. The sums are provided to the set of registers R and the set of registers λ after one left-shift (circular shift for the set of registers λ). The content of counter dR is decremented. The method now stops because counter dR indicates a degree less than t=3.

At the end of step 5, the coefficients contained in registers $R_5$ to $R_3$ are the coefficients of the error correction polynomial R(x), and the coefficients contained in registers λ3 to λ0 are the coefficients of the error locator polynomial λ(x) (in fact, each of these polynomials is multiplied by a constant, in this case, $\alpha^{10}$, which does not affect the error correction). In this example, the polynomials found are:

$$R(x) = \alpha^5 x + \alpha, \text{ and}$$

$$\lambda(x) = \alpha^5 x^3 + \alpha x + \alpha^2.$$

The roots of polynomial λ(x) are $\alpha^{10}$ and $\alpha^3$, which means that, among the received coefficients, those having indexes 15−10=5 and 15−3=12 are erroneous. The corresponding errors are $\alpha^{11}$ and $\alpha^7$.

Figure 2:
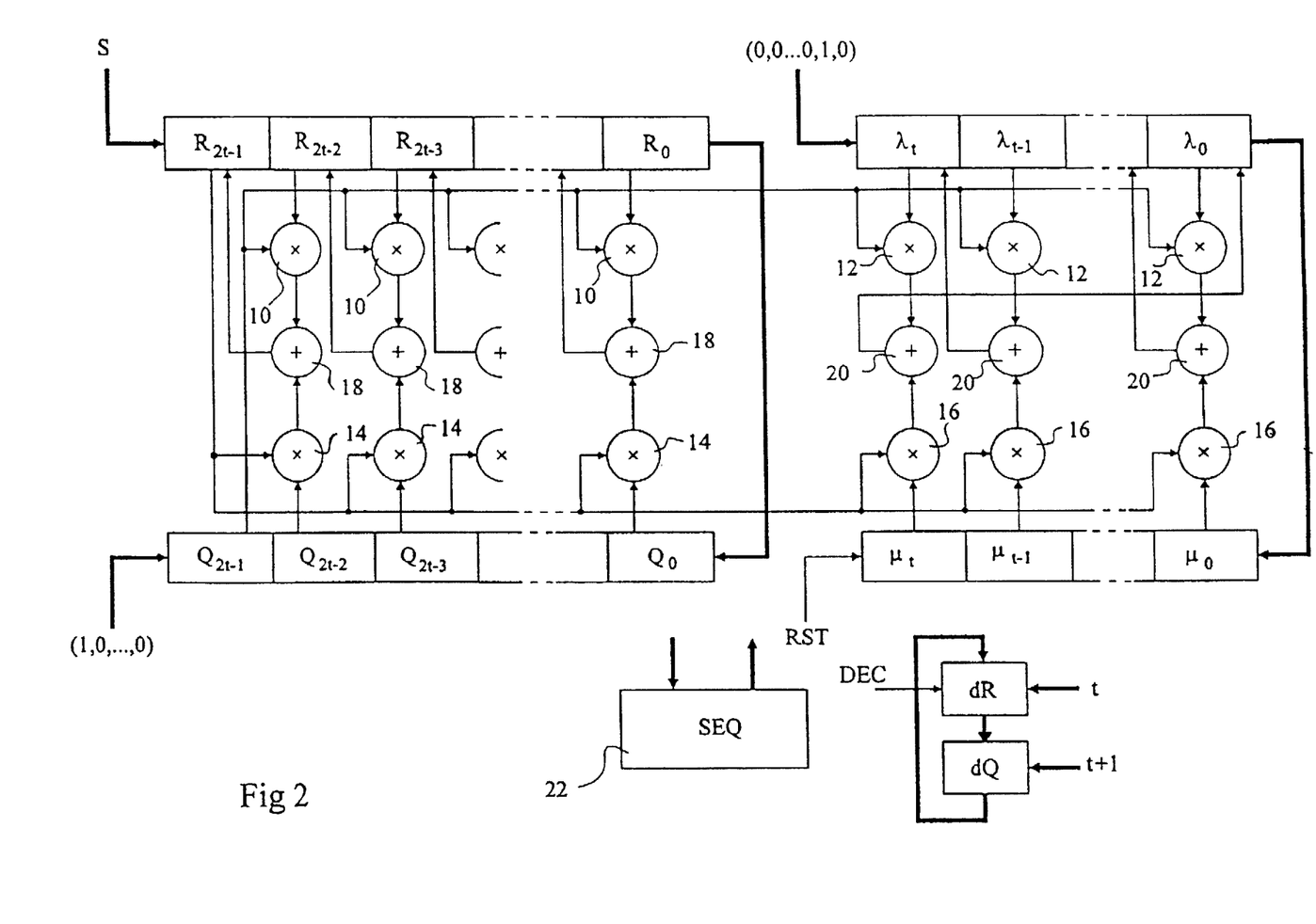
FIG. 2 represents an embodiment of a circuit carrying out a method according to the present invention.

FIG. 2 represents an embodiment of a circuit for carrying out a method according to the invention. This circuit can easily be extended to any Reed-Solomon code. Each register $R_{2t-2}$ to $R_0$ provides its content to a respective multiplier 10; each register $\lambda_r$ to $\lambda_0$ provides its content to a respective multiplier 12; each register $Q_{2t-2}$ to $Q_0$ provides its content to a respective multiplier 14; and each register $\mu_r$ to $\mu_0$ provides its content to a respective multiplier 16. The content of register $R_{2t-1}$ is provided to a second input of multipliers 14 and 16, and the content of register $Q_{2t-1}$ is provided to a second input of multipliers 10 and 12. The outputs of multipliers 10 and 14 associated with registers $R_i$ and $Q_i$ are provided to a respective adder 18 whose output is provided to register $R_{i+1}$. The outputs of multipliers 12 and 16 associated with registers $\lambda_i$ and registers $\mu_i$ are provided to a respective adder 20 whose output is provided to register $\lambda_{i+1}$, or $\lambda_0$ if i=t.

The set of registers R is connected so that it receives initial values corresponding to the coefficients of syndrome S. The set of registers $\lambda$ is connected so that it receives the initial values 0,0, . . . ,0,1,0. The set of registers Q is connected so that it receives the initial values 1,0, . . . ,0. Finally, the set of registers $\mu$ has a reset input RST. The set of registers R and the set of registers $\lambda$ are connected to the set of registers Q and the set of registers $\mu$, respectively, so that the contents of the set of registers R and the set of registers $\lambda$ can be transmitted to the set of registers Q and $\mu$. In FIG. 2, counter dR and register dQ are looped.

Counter dR has a decrementation input DEC and is initialized at a value t. Correspondingly, register dQ is initialized at a value t+1. In this embodiment, counter dR is initialized at value t, instead of value 2t−1 corresponding to the syndrome degree as shown in a previous embodiment, because it is easier to compare the value of counter dR with 0 rather than with t−1 to determine when the method must stop.

A sequencer 22 compares the content of register $R_{2t-1}$ with 0, and compares the content of counter dR with the content of register dQ to select step a) or step b). Sequencer 22 controls the registers and the counter so that the above described operations are obtained. Such a sequencer can be easily realized by those skilled in the art, who, for example, can translate the steps of the above method in a logic circuit description language, such as VHDL.

The multipliers and adders of the circuit of FIG. 2 are wired to execute the multiplication and the addition defined for the considered finite field.

The addition (Exclusive-OR) is simpler than the addition of binary numbers; however, the multiplication is more complex.

If the product 2nt (n being the number of bits of each coefficient) is lower than the number of coefficients in the transmitted Reed-Solomon codes, instead of using the two multipliers associated with each adder 18, 20, the system can use only one sequential multiplier which, in n cycles, executes a multiplication of two numbers of n bits. With the sequential multipliers, the determination of polynomials $\lambda$ and R takes 2nt cycles instead of only 2t cycles. This is not a drawback if 2nt cycles are available to process each Reed-Solomon code because the circuit would then include half the number of (sequential) multipliers which are, furthermore, simpler than non-sequential multipliers.

Figure 3:
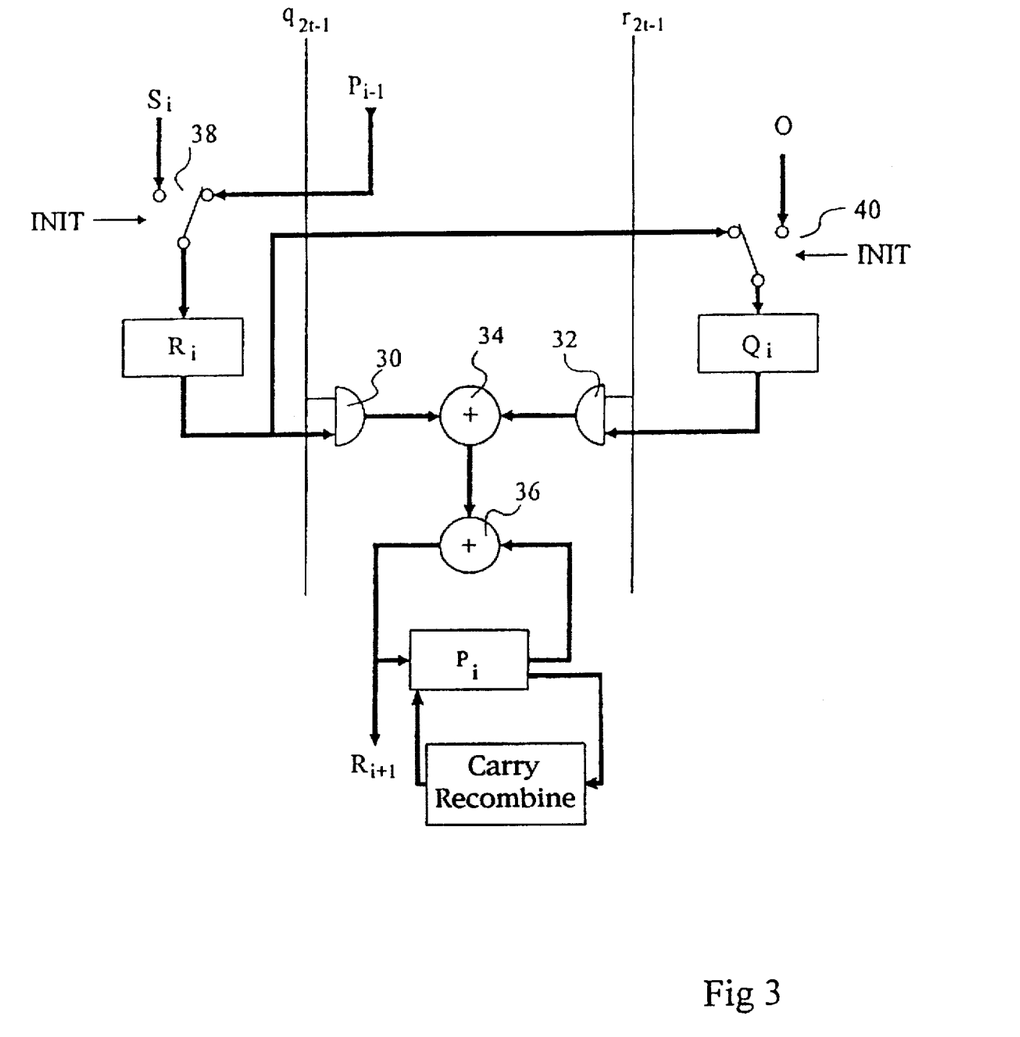
FIG. 3 partially represents an alternative embodiment of a circuit carrying out a method according to the present invention.

FIG. 3 represents a sequential multiplier associated with a pair of registers $R_i$ and $Q_i$ (i≠2t−1). The outputs of registers $R_i$ and $Q_i$ are provided to respective sets of AND gates 30 and 32. Gates 30 are such that they transmit the output of register $R_i$ to a first input of an adder 34 if a line $q_{2t-1}$ is at 1. Gates 32 are such that they transmit the output of register $Q_i$ to a second input of adder 34 if a line $r_{2t-1}$ is at 1. Lines $q_{2t-1}$ and $r_{2t-1}$ successively receive the bits of decreasing weight of registers $Q_{2t-1}$ and $R_{2t-1}$, respectively. The output of adder 34 is added to the content of a register $P_i$ by adder 36. The output of adder 36 is provided to register $R_{i+1}$ of the next stage, and register $R_i$ receives the output of adder 36 of the preceding stage.

The successive bits of register $Q_{2t-1}$ are provided on line $q_{2t-1}$ at the same time as the successive bits of register $R_{2t-1}$ are provided on the line $r_{2t-1}$. Thus, the AND gates 30 and 32 successively provide partial multiplications of the contents of registers $R_i$ and $Q_{2t-1}$ and of the contents of registers $Q_i$ and $R_{2t-1}$. The sum of each pair of partial multiplications, provided by adder 34, is added to the content of register $P_i$, which is left-shifted at each addition. Register $P_i$ has the same size as registers $R_i$ and registers $Q_i$ and, when it overflows, the carry is recombined with bits of registers $P_i$ to obtain a multiplication in the considered finite field. In the above-mentioned example of the 16-element finite field, the carry is recombined with bits of weights 0 and 1.

As shown, a switch 38 is placed at the input of register $R_i$. In a first position of this switch, register $R_i$ receives the output of adder 36 of the preceding stage (if i=0, it receives value 0). In a second position selected by enabling a signal INIT, register $R_i$ receives the syndrome coefficient $S_i$.

A switch 40 is placed at the input of register $Q_i$. In a first position of switch 40, register $Q_i$ receives the output of register $R_i$. In a second position of switch 40, selected by enabling signal INIT, register $R_i$ receives a 0 (or 1, if i=2t−1).

The stages associated with the set of registers $\lambda$ and the set of registers $\mu$ are similar.

Initially, signal INIT is enabled. Registers R, Q, $\lambda$, and $\mu$ receive the corresponding initialization values ($S_i$, 0, 1) and are enabled to load these values.

A succession of steps a) and b) as above described is executed. Each step includes n sub-steps of partial multiplication during which sequencer 22 successively provides the n bits of register $R_{2t-1}$ on line $r_{2t-1}$ and, at the same time, the n bits of register $Q_{2t-1}$ on line $q_{2t-1}$. At each of these sub-steps, registers P are enabled so that they shift the data to the left with a carry recombination.

At the end of each n sub-step of partial multiplication, adders 36 provide the final results. Each of the register sets R and $\lambda$ is then enabled by the sequencer to receive these results. During step b), the set of registers Q and the set of registers $\mu$ are enabled at the same time as the set of registers R and the set of registers $\lambda$ to receive the old values of the set of registers R and the set of registers $\lambda$.

As is apparent to those skilled in the art, various modifications can be made to the above disclosed preferred embodiments. For example, instead of swapping the contents of counter dR and register dQ and then decrementing counter dR, the content of counter dR can merely be transferred into register dQ, without decrementing the counter. In addition, to detect the end of the method, the system can count t steps a) or b) instead of controlling the content of counter dR.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A Reed-Solomon decoder comprising:

a first set of registers having contents initialized to values corresponding to coefficients of a syndrome polynomial of degree 2t–1;

a second set of registers having contents initialized to zero except for a second register of the second set which has a content initialized to 1;

a third set of registers connected to outputs of the first set of registers, the third set of registers having contents initialized to zero except for a last register of the third set which has a content initialized to 1;

a fourth set of registers connected to outputs of the second set of registers, the fourth set of registers having contents initialized to zero;

a calculation circuit associated with each register of the first and second sets, to provide each register with a sum of a product of a content of a preceding register of said first and second sets by the content of the last register of the third set and a product of a content of the corresponding registers of the third and fourth sets by a content of the last register of the first set, wherein the calculation circuit includes a plurality of first calculation circuit portions, wherein a first calculation circuit portion associated with a first register of the second set executes calculations from contents of last registers of the second and fourth sets;

a counter and an indicator register, respectively initialized to a first number and a number exceeding the first number by 1, the indicator register being connected to an output of the counter; and a sequencer that:
  a) enables writing of the first and second sets of registers and decrementing of the content of the counter when the content of the counter is higher than or equal to the content of the indicator register or the content of the last register of the first set is zero,
  b) enables writing of the first, second, third and fourth sets of registers and the indicator register when both the content of the counter is lower than the content of the indicator register and the content of the last register of the first set is non-zero, and
  c) stops when the content of the counter is decreased by t.

2. The Reed-Solomon decoder of claim 1, wherein the calculation circuit further includes, for each associated register of the first and second sets, a second calculation circuit portion having:

first and second lines successively receiving bits of the last registers of the first and third sets, respectively;

a first set of gates that transmit an output of the associated register of the first and second sets when the second line is at 1, and a second set of gates that transmit an output of the corresponding register of the third and fourth sets when the first line is at 1;

a first adder that receives the outputs of the first and second sets of gates; and a second adder that adds the output of the first adder to a content of a multiplication register, the content of the multiplication register being successively shifted to the left and a carry being recombined with this content so that a multiplication in a finite field is carried out.

3. The Reed-Solomon decoder of claim 1, wherein the counter is connected to an output of the indicator register, and wherein the sequencer is operable to enable writing of the counter and to decrement the counter when writing of the first, second, third and fourth sets of registers is enabled.

4. A method for determining coefficients required to correct up to t errors in data transmitted as Reed-Solomon codes, comprising the steps of:

A. determining coefficients of a syndrome polynomial of degree 2t–1;

B. storing the coefficients of the syndrome polynomial in a first set of registers, storing coefficients which are all zero except for a second coefficient, equal to 1, in a second set of registers, and storing a first number as a content in a counter, wherein the number initially stored in the counter is t;

C. storing coefficients which are all zero except for a last coefficient, equal to 1, in a third set of registers, storing coefficients which are all zero in a fourth set of registers, and storing a second number exceeding the first number by 1 in an indicator register;

D. when the content of the counter is greater than or equal to the content of the indicator register or the content of the last register of the first set is zero, storing in each register of the first and second sets a sum of a product of the content of a preceding register of said first and second sets by the content of a last register of the third set, and a product of the content of the corresponding registers of the third and fourth sets by the content of a last register of the first set, and decrementing the counter;

E. when both the content of the counter is less than the content of the indicator register and the content of the last register of the first set is non-zero, storing in each register of the first and second sets a sum of a product of the content of a preceding register of said first and second sets by the content of a last register of the third set, and a product of a content of the corresponding registers of the third and fourth sets by the content of a last register of the first set, decrementing the counter, and transferring the contents of the first and second sets of registers and of the counter into the third and fourth sets of registers and the indicator register, respectively; and F. repeating steps D and E until the content of the counter is decremented by t, and then reading coefficients of an error correction polynomial and coefficients of an error locator polynomial, respectively, in the first and second sets of registers.

5. The method of claim 4, wherein the first and third sets each include 2t registers, and the second and fourth sets each include t+1 registers, the first register of the second set receiving a product of the last registers of said second and third sets and a product of the last registers of the first and fourth sets.

6. The method of claim 4, wherein step E further includes steps of swapping the contents of the counter and of the indicator register and decrementing the counter.

7. The method of claim 4, wherein each sum of products is obtained according to the following steps:

successively establishing first partial products of bits of a last register of the first set by a content of a register of the third and fourth sets;

successively establishing second partial products of bits of the last register of the third set by a content of a register of the first and second sets; and successively forming sums of the first and second partial products and adding the sums to a content of a product register, left-shifted at each addition.

8. A circuit for providing Reed-Solomon code correction information, comprising:
- a first set of registers for initially storing coefficients of a polynomial;
- a second set of registers for initially storing a first predetermined set of values;
- a third set of registers for initially storing a second predetermined set of values;
- a fourth set of registers for initially storing a third predetermined set of values, each register having a content and a position within its set;
- a calculation circuit, coupled to the first, the second, the third, and the fourth sets of registers, that calculates a first set of results according to the contents of the first and third sets of registers, and a second set of results according to the contents of the second and fourth sets of registers, and that stores the first and second sets of results in the first and second sets of registers, respectively, wherein the calculation circuit includes:
    - a plurality of first circuit portions, each first circuit portion having a first input coupled to one first set register, an output coupled to another first set register, and a second input coupled to a third set register, the one first set register having a position in the first set of registers that corresponds to a position of the third set register, the another first set register having a position subsequent to the position of the one first set register,
    - a plurality of second circuit portions, each second circuit portion having a first input coupled to one second set register, an output coupled to another second set register, and a second input coupled to a fourth set register, the one second set register having a position in the second set of registers that corresponds to a position of the fourth set register, the another second set register having a position subsequent to the position of the one second set register, and
    - a circular circuit portion having a first input coupled to a second set register having a last position, a second input coupled to a fourth set register having a last position, and an output coupled to a second set register having a first position:
- a first control register for initially storing a predetermined number;
- a second control register, coupled to the first control register, for initially storing the predetermined number plus 1; and
- a sequencing circuit, coupled to the first and second control registers, a first set register of the first set of registers having a last position, and the calculation circuit, the sequencing circuit operating the calculation circuit to perform a series of steps, and decrementing the content of the first control register during each of the series of steps.

9. The circuit of claim 8, wherein the sequencing circuit includes:
- write enabling circuitry, coupled to the first, second, third, and fourth sets of registers, that enables the third and fourth sets of registers to store the contents of the first and second sets of registers when both a content of the first set register having a last position is non-zero and the content of the first control register is less than the content of the second control register.

10. The circuit of claim 8, wherein the calculation circuit includes a plurality of partial product portions, each partial product portion having:
- a first partial multiplication circuit having a first input coupled to the third set register having the last position, a second input coupled to a respective one of the first set of registers, and an output that provides a first partial multiplication result;
- a second partial multiplication circuit having a first input coupled to the first set register having the last position, a second input coupled to a respective one of the third set of registers having a position corresponding to the respective position of the one of the first set of registers, and an output that provides a second partial multiplication result; and
- adding circuitry having a first input coupled to the output of the first partial multiplication circuit, a second input coupled to the output of the second partial multiplication circuit, and an output coupled to a respective first set register having a position subsequent to the position of the one of the first set of registers.

11. The circuit of claim 8, wherein:
- a second value in the first predetermined set of values equals 1, and values other than the second value in the first predetermined set of values equals 0;
- a last value in the second predetermined set of values equals 1, and values other than the last value in the second predetermined set of values equals 0; and
- each of the third set of predetermined values equals 0.

12. A method for providing Reed-Solomon code correction information, the method comprising the steps of:
- A. storing, in a first set of registers, coefficients of a polynomial;
- B. setting contents of a second set of registers, a third set of registers, and a fourth set of registers to a first set of initialized values, a second set of initialized values, and a third set of initialized values, respectively;
- C. initializing a content of a first control register to a predetermined number;
- D. initializing a content of a second control register to the predetermined number plus 1;
- E. calculating a first set of results according to the contents of the first and third sets of registers, wherein step E includes, for each respective first register of the first set, the steps of:
    - calculating a first product by multiplying the content of the first set register having the last position with the content of a third set register having a position that corresponds to the respective first set register;
    - calculating a second product by multiplying the content of a third set register having a last position with the content of the respective first set register; and
    - adding the first product to the second product to produce a respective first set result;
- F. calculating a second set of results according to the contents of the second and fourth sets of registers, wherein step F includes, for each respective second set register of the second set, the steps of:
    - calculating a third product by multiplying the content of the first set register having the last position with the content of a fourth set register having a position that corresponds to the respective second set register;
    - calculating a fourth product by multiplying the content of the third set register having the last position with the content of the respective second set register, and
    - adding the third product to the fourth product to produce a respective second set result;
- G. replacing the contents of the third and fourth sets of registers with the contents of the first and second sets of registers and swapping the content of the first control register with the content of the second control register, when both a content of a first set register of the first set of registers having a last position is non-zero and the content of the first control register is less than the content of the second control register;

H. storing the first and second set of results in the first and second sets of registers, respectively, wherein a second set register having a first position is considered subsequent to a second set register having a last position, wherein step H includes the steps of:

storing each first set result in the first set register having a position subsequent to the position of the respective first set register; and storing each second set result in the second set register having a position subsequent to the position of the respective second set register, wherein the step of storing each second set result:

storing the second set result that corresponds to the second set register having the last position in the second set register having the first position; and I. decrementing the content of the first control register.

13. The method of claim 12, wherein step B includes the steps of:

setting the contents of a second set register having a second position to 1, and the contents of other second set registers having positions other than the second position to 0;

setting the contents of a third set register having a last position to 1, and the contents of other third set registers having positions other than the last position to 0; and setting the contents of the fourth set of registers to 0.

14. The method of claim 12, wherein step E further includes the steps of:

providing a plurality of first partial multiplication results according to the content of a third set register having a last position and the contents of the first set of registers;

providing a plurality of second partial multiplication results according to the content of the first set register having the last position and the contents of the third set of registers;

adding the first partial multiplication results to the second partial multiplication results to produce a plurality of sums; and combining the plurality of sums to produce the first set of results.

15. The method of claim 14, wherein the step of combining the plurality of sums includes the step of:

shifting the plurality of sums into a shift register to provide multiplication in a finite filed.

16. A circuit for providing Reed-Solomon code correction information, the circuit comprising:

a first set of registers that stores coefficients of a polynomial;

a register initializing circuit that sets contents of a second set of registers, a third set of registers, and a fourth set of registers to a first set of initialized values, a second set of initialized values, and a third set of initialized values, respectively;

a first control register initializing circuit that initializes a content of a first control register to a predetermined number;

a second control register initializing circuit that initializes a content of a second control register to the predetermined number plus 1;

means, coupled to the first, the second, the third, and the fourth set of registers, and the first and the second control registers, for calculating a first set of results according to the contents of the first and third sets of registers, and a second set of results according to the contents of the second and fourth sets of registers, and for replacing the contents of the third and fourth sets of registers with the contents of the first and second sets of registers and for swapping the content of the first control register with the content of the second control register, when both a content of a first set register of the first set of registers having a last position is non-zero and the content of the first control register is less than the content of the second control register, wherein the means for calculating and replacing, for each respective first set register, includes:

a first product circuit that calculates a first product by multiplying the content of the first set register having the last position with the content of a third set register having a position that corresponds to the respective first set register;

a second product circuit that calculates a second product by multiplying the content of a third set register having a last position with the content of the respective first set register; and a first adding circuit that adds the first product to the second product to produce a respective first set result, wherein the means for calculating and replacing, for each respective second set register, further includes:

a third product circuit that calculates a third product by multiplying the content of the first set register having the last position with the content of a fourth set register having a position that corresponds to the respective second set register;

a fourth product circuit that calculates a fourth product by multiplying the content of the third set register having the last position with the content of the respective second set register; and a second adding circuit that adds the third product to the fourth product to produce a respective second set result;

a storing circuit coupled to the first and the second calculating circuits and the first and the second sets of registers, that stores the first and second set of results in the first and second sets of registers, respectively, wherein the storing circuit includes:

a first portion that stores each first set result in the first set register having a position subsequent to the position of the respective first set register; and a second portion that stores each second set result in the second set register having a position subsequent to the position of the respective second set register, wherein a second set register having a first position is considered subsequent to a second set register having a last position, and wherein the second portion of the storing circuit includes:

storing circuitry that stores a second set result that corresponds to the second set register having the last position in the second set register having the first position; and a decrementing circuit coupled to the first control register, that decrements the content of the first control register.

17. The circuit of claim 16, wherein the initializing circuit includes:

a first portion coupled to the second set of registers, that sets the contents of a second set register having a second position to 1, and the contents of other second set registers having positions other than the second position to 0;

a second portion coupled to the third set of registers, that sets the contents of a third set register having a last position to 1, and the contents of other third set registers having positions other than the last position to 0; and a third portion coupled to the fourth set of registers, that sets the contents of the fourth set of registers to 0.

18. The circuit of claim 16, wherein the means for calculating and replacing further includes:

a first multiplying circuit that provides a plurality of first partial multiplication results according to the content of a third set register having a last position and the contents of the first set of registers;

a second multiplying circuit that provides a plurality of second partial multiplication results according to the content of the first set register having the last position and the contents of the third set of registers;

an adding circuit coupled to the first and second multiplying circuits, that adds the first partial multiplication results to the second partial multiplication results to produce a plurality of sums; and a combining circuit coupled to the adding circuit, that combines the plurality of sums to produce the first set of results.

19. The circuit of claim 18, wherein the combining circuit includes:

a shifting circuit that shifts the plurality of sums into a shift register to provide multiplication in a finite filed.

* * * * *